(12) United States Patent
Giles et al.

(10) Patent No.: US 7,228,440 B1
(45) Date of Patent: Jun. 5, 2007

(54) SCAN AND BOUNDARY SCAN DISABLE MECHANISM ON SECURE DEVICE

(75) Inventors: Christopher M. Giles, Lafayette, CO (US); Simon Bewick, Finchampstead (GB); Kalvin E. Williams, Thatcham (GB)

(73) Assignee: LSI Corporation, Milpitas, CA (US)

( * ) Notice: Subject to any disclaimer, the term of this patent is extended or adjusted under 35 U.S.C. 154(b) by 826 days.

(21) Appl. No.: 10/325,382

(22) Filed: Dec. 20, 2002

Related U.S. Application Data

(60) Provisional application No. 60/356,605, filed on Feb. 13, 2002.

(51) Int. Cl.
*H04L 9/32* (2006.01)
*H04N 7/16* (2006.01)
*G06F 11/00* (2006.01)
*G01R 31/28* (2006.01)

(52) U.S. Cl. .......................... 713/202; 726/26; 726/27; 714/30; 714/726; 714/727

(58) Field of Classification Search .................... 726/2, 726/26, 27, 28, 29, 30; 725/25; 380/210, 380/211, 240, 241; 714/30, 726, 727, 729

See application file for complete search history.

(56) References Cited

U.S. PATENT DOCUMENTS

| 4,694,489 | A | * | 9/1987 | Frederiksen | 380/212 |
|---|---|---|---|---|---|
| 5,228,084 | A | * | 7/1993 | Johnson et al. | 705/71 |
| 5,406,627 | A | * | 4/1995 | Thompson et al. | 380/237 |
| 5,440,632 | A | * | 8/1995 | Bacon et al. | 380/242 |
| 5,710,815 | A | * | 1/1998 | Ming et al. | 380/241 |
| 5,734,853 | A | * | 3/1998 | Hendricks et al. | 715/716 |
| 6,009,540 | A | * | 12/1999 | Craft et al. | 714/30 |
| 6,088,802 | A | * | 7/2000 | Bialick et al. | 726/3 |
| RE36,988 | E | * | 12/2000 | Johnson et al. | 725/25 |
| 6,499,124 | B1 | * | 12/2002 | Jacobson | 714/727 |
| 6,542,609 | B1 | * | 4/2003 | Ryan et al. | 380/210 |
| 6,959,090 | B1 | * | 10/2005 | Alve et al. | 380/277 |
| 7,043,758 | B2 | * | 5/2006 | Grupe | 726/24 |
| 7,047,462 | B2 | * | 5/2006 | Brown et al. | 714/724 |
| 2003/0115593 | A1 | * | 6/2003 | Alten et al. | 725/28 |
| 2003/0204801 | A1 | * | 10/2003 | Tkacik et al. | 714/726 |

\* cited by examiner

*Primary Examiner*—Cynthia Britt
*Assistant Examiner*—Jaric Loving
(74) *Attorney, Agent, or Firm*—Christopher P. Maiorana PC

(57) ABSTRACT

A circuit generally comprising a logic module and a security module is disclosed. The logic module may be configured to set a plurality of values to a plurality of predetermined values respectively while in a scan mode. The security module may be configured to (i) disable a scan capability of the values while in a non-lowest security mode of at least three security modes and (ii) enabling the scan capability while in a lowest security mode of the security modes.

20 Claims, 6 Drawing Sheets

| MASTER | TARGET | SRC[SEC] VALUE | OTHER RELEVANT SRC BITS | ACCESS RESTRICTIONS |
|---|---|---|---|---|
| CPU | REGISTERS (1) | SEC_DIS | N/A | READ/WRITE |
| CPU | REGISTERS | SEC_APP | N/A | READ/WRITE (2) |
| CPU | REGISTERS | SEC_PRIV | N/A | READ/WRITE |
| OTHER* | REGISTERS | SEC_DIS | N/A | READ/WRITE |
| OTHER* | REGISTERS | SEC_APP | N/A | READ/WRITE (2) |
| OTHER* | REGISTERS | SEC_PRIV | N/A | ALL ACCESS RESTRICTED |
| CPU | BOOT ROM | SEC_DIS | N/A | ALL ACCESS RESTRICTED |
| CPU | BOOT ROM | SEC_APP | N/A | ALL ACCESS RESTRICTED |
| CPU | BOOT ROM | SEC_PRIV | N/A | READ ONLY |
| OTHER* | BOOT ROM | SEC_DIS, SEC_APP, SEC_PRIV | N/A | ALL ACCESS RESRICTED |

FIG. 8

SCAN AND BOUNDARY SCAN DISABLE MECHANISM ON SECURE DEVICE

CROSS REFERENCE TO RELATED APPLICATIONS

This application claims the benefit of U.S. Provisional Application No. 60/356,605, filed Feb. 13, 2002 which is hereby incorporated by reference in its entirety.

The present application is related to co-pending applications Ser. No. 10/326,440 filed concurrently, Ser. No. 10/325,132 filed concurrently, Ser. No. 10/324,976 filed concurrently, and Ser. No. 10/325,192 filed concurrently.

FIELD OF THE INVENTION

The present invention relates to chip data security generally and, more particularly, to a scan and boundary scan disable mechanism on a secure device.

BACKGROUND OF THE INVENTION

Digital video Set-Top Box (STB) security is an evolving process. As pirating knowledge increases, the amount of security designed into the STBs is increased to avoid illegal access to descrambling technology. Smart cards are currently being used to provide security for decryption codes. Additional security measures could be introduced to help protect the rest of the box.

SUMMARY OF THE INVENTION

The present invention concerns a circuit generally comprising a logic module and a security module. The logic module may be configured to set a plurality of values to a plurality of predetermined values respectively while in a scan mode. The security module may be configured to (i) disable a scan capability of the values while in a non-lowest security mode of at least three security modes and (ii) enabling the scan capability while in a lowest security mode of the security modes.

The objects, features and advantages of the present invention include providing a circuit, method and/or architecture that may provide (i) secured and One-Time Programmable (OTP) memory, (ii) internal boot read-only memory (ROM), (iii) authentication and disable of an Extended Joint Test Action Group (EJTAG) debug interface, (iv) exception vector intercept, and/or (v) cache lockout.

BRIEF DESCRIPTION OF THE DRAWINGS

These and other objects, features and advantages of the present invention will be apparent from the following detailed description and the appended claims and drawings in which:

FIG. 8 is a table of a security supervisor module protection process; and

DETAILED DESCRIPTION OF THE PREFERRED EMBODIMENTS

Figure 1:
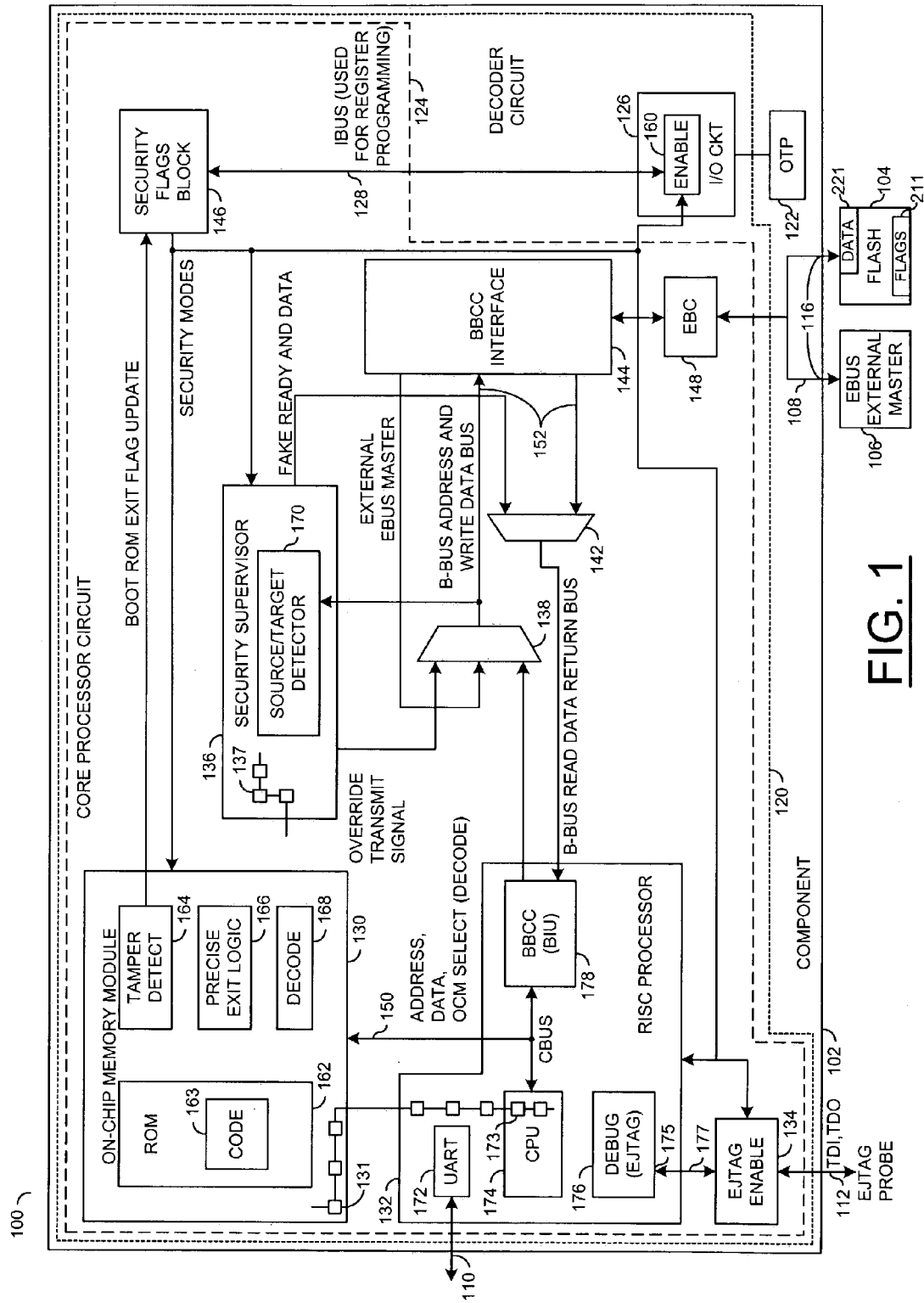
FIG. 1 is a partial block diagram of a circuit in accordance with a preferred embodiment of the present invention.

Referring to FIG. 1, a partial block diagram of a circuit or system 100 is shown in accordance with a preferred embodiment of the present invention. The partial block diagram is not generally meant to be a completely accurate depiction of the present invention's architecture, but rather a high-level functional overview of the modules that impact the security features. The circuit 100 generally comprises a circuit or component 102, a memory 104, a circuit 106, and a bus 108. An interface 110 may be provided in the circuit 100 for general purpose serial communications. An interface 112 may be provided in the circuit 100 for debug testing.

The component 102 may be implemented as a single-chip or a multiple-chip source decoder for digital video and/or audio signals. The component 102 may provide the interfaces 110 and 112 to the circuit 100. An interface 116 may be provided in the component 102 to couple to the bus 108.

The memory 104 may be implemented as an electrically erasable programmable read-only memory (EEPROM). In one embodiment, the memory 104 may be implemented as a FLASH memory. The memory 104 may be coupled to the bus 108 for access by the component 102 and the circuit 106.

The circuit 106 may be implemented as an external bus master on the bus 108. The bus 108 may be configured as an external bus (e.g., E-Bus) connecting the component 102 to the other external circuits and/or external memory blocks. Various standards and protocol may be implemented for the bus 108 to meet the criteria of a particular application.

The interface 110 may be implemented as a universal asynchronous receiver/transmitter (UART) interface. The interface 112 may be implemented as a Joint Test Action Group (JTAG) architecture interface or an EJTAG interface. The JTAG interface is generally defined in The Institute of Electrical and Electronics Engineering (IEEE) Standard 1149.1–2001, titled "IEEE Standard Test Access Port and Boundary-Scan Architecture", published by the IEEE, New York, N.Y., hereby incorporated by reference in its entirety. The EJTAG interface is generally defined in the "EJTAG Specification", Revision 2.61, September 2001, published by MIPS Technologies, Inc., Mountain View, Calif., hereby incorporated by reference in its entirety.

The component 102 generally comprises a circuit or chip 120 and a memory or chip 122. The component 102 may be configured to perform a source decoding for digital video and/or audio signals. The memory 122 may be configured as a one-time programmable (OTP) memory module. The OTP memory module 122 may store security related information for the decoder circuit 120. In one embodiment, the decoder circuit 120 and the OTP memory module 122 may be fabricated on the same chip.

The decoder circuit 120 generally comprises a circuit 124 and a circuit 126 connected by an internal bus (e.g., I-Bus) 128. The circuit 124 may be implemented as a core processor circuit. The core processor circuit 124 may be a customer-owned tooling (COT) die or chip. The circuit 126 may be implemented as an input/output (I/O) circuit. The I/O circuit 126 may couple the I-Bus 128 to the OTP memory module 122. The I/O circuit 126 is generally fabricated on the same chip as the core processor circuit 124.

The core processor circuit 124 generally comprises a circuit or block 130, a circuit or block 132, a circuit or block 134, a circuit or block 136, a multiplexer 138, a multiplexer 142, a circuit or block 144, a circuit or block 146, a circuit or block 148, a bus 150 and a bus 152. The circuit 130 may be implemented as an on-chip memory (OCM) module. The circuit 132 may be implemented as a processor module. In one embodiment, the processor module 132 may be a reduced instruction set computer (RISC) processor module. The circuit 134 may be implemented as an EJTAG enable module. The circuit 136 may be configured as a security supervisor block or module for the bus 152. The circuit 144 may be implemented as a basic bus and cache controller (BBCC) interface module. The circuit 146 may be configured as a security flags block or module. The circuit 148 may be implemented as an external bus controller (EBC) module. The bus 150 may be implemented as a core bus (e.g., C-Bus). The bus 152 may be implemented as a system or basic bus (e.g., B-Bus).

The I/O circuit 126 may include a circuit or block 160. The circuit 160 may be implemented as an enable module for communicating with the OTP memory module 122.

The OCM module 130 generally comprises a memory 162, a circuit or block 164, a circuit or block 166 and a circuit or block 168. The memory 162 may be implemented as a read-only memory (ROM) module. In one embodiment, the ROM module 162 may be configured as a bootstrap ROM or boot ROM for short. The boot ROM module 162 may store a code 163 containing instructions. The circuit 164 may be implemented as a tamper detect module. The circuit 166 may be implemented as a precise exit logic module. The circuit 168 may be implemented as an address decode module for decoding addresses on the C-Bus 150 intended for the boot ROM module 162.

The circuit 132 generally comprises a circuit or block 172, a circuit or block 174, a circuit or block 176 and a circuit or block 178. The circuit 172 may be implemented as a UART module. The circuit 174 may be implemented as a Central Processor Unit (CPU) module. The circuit 176 may be implemented as a debug port module or a Test Access Port (TAP) module. The debug port module 176 may be compliant with the EJTAG specification and/or the JTAG specification. Other debug specifications may be implemented to meet the criteria of a particular application. The circuit 178 may be implemented as a basic bus and cache controller (BBCC) module.

The circuit 136 generally comprises a circuit 170. The circuit 170 may be configured as a source/target detector module. The source/target detector module 170 may detect a master (source) and a target address of each transaction of the B-Bus 152.

The system 100 may have multiple security modes or states. In one embodiment, the system 100 may have a Secure Disabled (SEC_DIS) mode, a Secure Application (SEC_APP) mode and a Secure Privileged (SEC_PRIV) mode. Other states and/or modes may be implemented to meet the criteria of a particular application.

The Secure Disable mode may be active or asserted when code executed from the boot ROM module 162 determines that security features may not be enforced, and therefore disables the protection. By definition, the CPU module 174 may no longer be executing from the boot ROM module 162 while in the Secure Disable mode. The Secure Disabled mode is generally used for a component 102 that have not yet had the OTP memory module 122 programmed and may include other uses. The Secure Disable mode may be a lowest of the security modes.

The Secure Application mode is generally asserted or active when the boot ROM determines that security in some form may be useful, including application software (code or firmware) execution. All or some security measures may be active in the Secure Application mode. By definition, the CPU module 174 may no longer be executing from boot ROM module 162 while in the Secure Application mode. The Secure Application mode may be an intermediate level security mode.

The Secure Privileged mode may be asserted or active while the CPU module 174 is still executing from boot ROM module 162. While in the Secure Privileged mode, the processor module 132 may access the OTP memory module 122 and/or the FLASH memory 104. The Secure Privileged mode may be a highest or tightest of the security modes.

Figure 2:
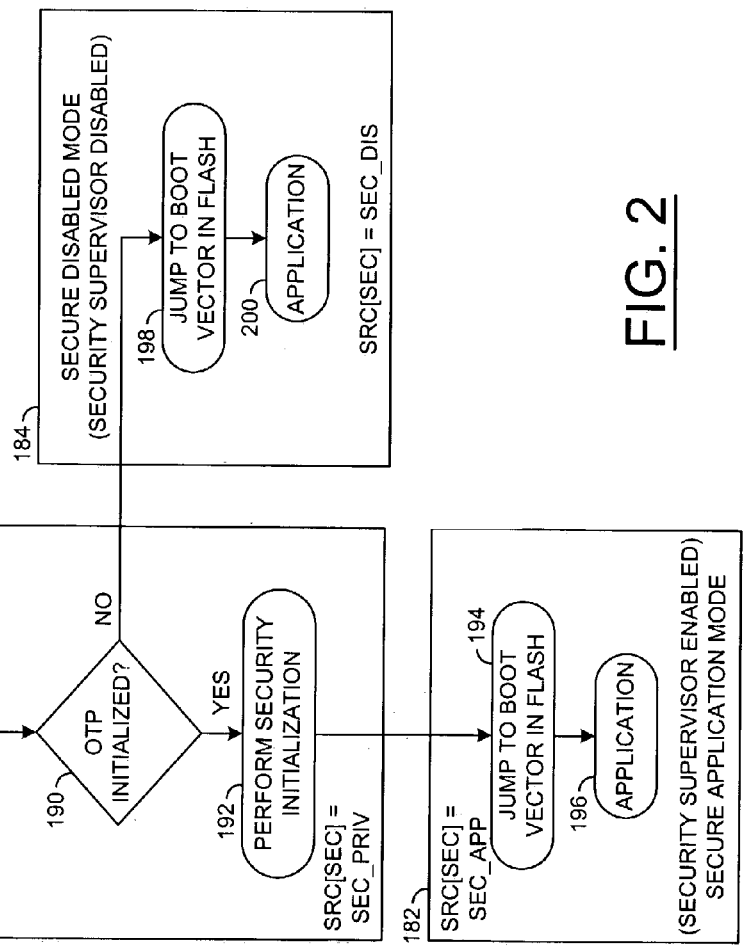
FIG. 2 is a flow diagram of a process of transitioning between security modes.

Referring to FIG. 2, a flow diagram of a process of transitioning between the security modes is shown. Operations expected to be performed in each security mode are generally indicated within a box labeled with the mode name. Transitions between boxes may represent instruction execution leaving the boot ROM module 162. The Secure Privileged mode is generally indicated by box 180. The Secure Application mode is generally indicated by box 182. The Secure Disable mode is generally indicated by box 184.

The process generally begins with the processor module 132 bootstrapping to the boot ROM module 162 (e.g., block 186). Instructions in the boot ROM module 162 may then be used to set up a driver for an interface between the I/O circuit 126 and the OTP memory module 122 (e.g., block 188). If the OTP memory module 122 has been initialized (e.g., the YES branch of decision block 190), one or more instructions stored in the boot ROM module 162 may be executed to perform a security initialization (e.g., block 192). Initialization of the OTP memory 122 may be determined by a state of a programmable flag stored within the OTP memory 122. If initialized, the OTP memory 122 may be configured for use by the system 100. The security initialization may begin to transition the system 100 from the Secure Privileged mode to the Secure Application mode. A jump instruction stored in the boot ROM module 162 may then cause the processor module 132 to execute a jump to a boot vector in the FLASH memory 104 (e.g., block 194). Once the system 100 has transitioned to the Secure Application mode, an application software may be executed from the FLASH memory 104 (e.g., block 196).

If the OTP memory module 122 is not initialized (e.g., the NO branch of decision block 190), one or more instructions stored in the boot ROM module 162 may initiate a transition of the system 100 from the Secure Privileged mode to the Secure Disabled mode. A jump instruction stored in the boot ROM module 162 may be executed to jump to a boot vector in the FLASH memory 104 (e.g., block 198). Once the system 100 has transitioned to the Secure Disabled mode, application software may execute from the FLASH memory 104 (e.g., block 200). The application software executed in the Secure Disabled mode may be the same or a different application software as the application software executed in the Secure Application mode.

Before the core processor circuit 124 is mounted in a package or housing (not shown) with the OTP module 122, the core processor circuit 124 may not be able to function as a secure part. In particular, until the core processor circuit 124 detects a programmed OTP module 122, the core processor circuit 124 may leave the Secure Privileged mode to the Secure Disabled mode. While in the Secure Disabled mode, decryption operations may be disabled.

In order to implement a feature that (i) a system identification (ID) and (ii) security flags may be programmable only once and not visible outside the packaged part, the component 102 may use the OTP memory 122 for storing security related items. The OTP memory 122, may be designed as a bit-serially-accessed nonvolatile, fused-region memory attached to the I/O circuit 126 and packaged together with the decoder circuit 120 die in a multi-chip package. Access to the OTP memory 122 may be defined according the rules summarized in Table I as follows:

TABLE I

| Mode | Access to OTP Memory |
| --- | --- |
| Secure Disabled | Read/Write |
| Secure Application | None |
| Secure Privileged | Read/Write |

Figure 3:
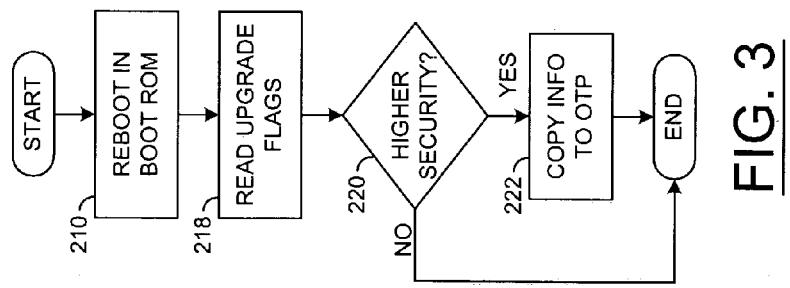
FIG. 3 is a flow diagram of a process for configuring a one-time programmable memory in the field.

Referring to FIG. 3, a flow diagram of a process for configuring the OTP memory module 122 in the field is shown. During normal operation of the system 100, a service being decrypted may provide a new security upgrade. The security upgrade generally sets security flag registers on-chip that may increase, but not decrease, security settings. The new security register settings may be written into the security flags module 146 by the application software and may not be effective until a next system reset. The decrypted service may also provide a new code release for storage in the FLASH memory 104 that contains one or more new security features or objects to be permanently burned into the OTP memory module 122. The system 100 may be reboot (e.g., block 210) once the new security features have been loaded into the FLASH memory 104.

Upon reboot, the boot ROM code may read a location 211 (FIG. 1) in the FLASH memory 104 containing the security flag upgrades. The upgrade flags may then be read from the FLASH memory 104 (e.g., block 218). If the updated flags indicate a same or lower security level than what is already stored in the OTP memory 122 (e.g., the NO branch of decision block 220), the configuration process may be halted. Therefore, attempts to decrease security levels may be ignored. If the upgrade flags stored in the FLASH memory 104 have higher security settings than what is currently stored in the OTP memory 122 (e.g., the YES branch of decision block 220), the upgrade information or data 221 (FIG. 1) stored in the FLASH memory 104 may be copied into the OTP memory 122 (e.g., block 222) by the boot ROM code. Upon a subsequent reboot, the security flag registers within the component 102 may be set according to the new values read from the OTP memory 122. Other flags not modified by the update through the FLASH memory 104 may be read from the OTP memory 122 to the appropriate registers.

The boot ROM module 122 may be accessed upon initialization in a secure component 102. The boot ROM module 122 may be accessible only at boot and may become inaccessible after the boot code has verified a secure installation. In one embodiment, the boot ROM module 122 may be implemented as 16 KB ROM. Other memory sizes may be implemented to meet a design criteria of a particular application.

The boot ROM module 122 may reside exclusively in an uncacheable address space of the processor 132. The uncacheablity of the boot ROM module 122 generally facilitates ease of design and integration. There may be no performance implications to the processor 132 as the boot ROM module 122 may be designed to provide access times similar to cache accesses, providing a high-performing boot sequence for various computationally intensive activities. In addition, a normal boot vector for an existing CPU module 174 as well as the bootstrap exception vectors and debug exception vectors may all reside within the uncacheable address space. The contents of the boot ROM module 162 may not be visible external to the component 102, nor determinable from external to the component 102. Access to the boot ROM module 162 may be governed by the rules summarized in Table II as follows:

TABLE II

| Mode | Execute from Boot ROM |
| --- | --- |
| Secure Disabled | No |
| Secure Application | No |
| Secure Privileged | Yes |

The component 102 may have three levels of security for EJTAG. A Baseline level of security may be defined as having no security available and access may be unrestricted at all times when asserted. An Authentication level of security may (i) allow access to all EJTAG features and (ii) the EJTAG debug port module 176 may undergo a challenge/response-based authentication via the UART port 110. Firmware may be used to implement the authentication protocols via the UART interface 110. The authentication protocols may be implemented by firmware, code or software. A Locked level of security may disable the EJTAG probe interface 112 without any authentication. The EJTAG security levels and the associated features may be summarized in Table III as follows:

TABLE III

| MODE | EJTAG Security Mode | Features Enabled | Disable EJTAG TAP |
| --- | --- | --- | --- |
| Secure Disable | Baseline | All | No |
| Secure Application | Baseline | All | No |
| Secure Application | Authenticate | All | No |
| Secure Application | Locked | Instruction based only | Yes |
| Secure Privileged | N/A | Instruction based only | Yes |

Figure 4:
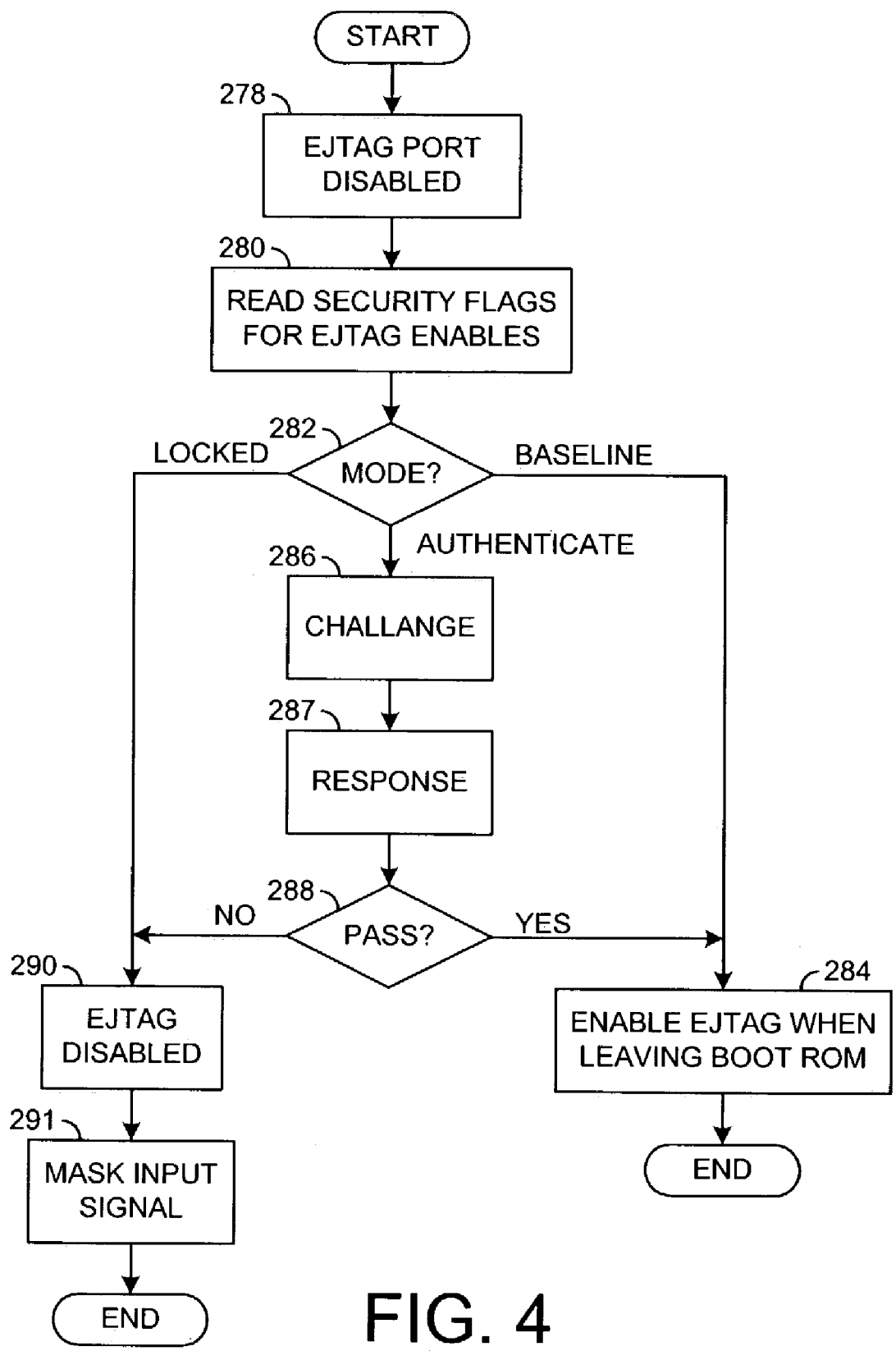
FIG. 4 is a flow diagram of a process to initialize EJTAG security flags.

Referring to FIG. 4, a flow diagram of a process to initialize the EJTAG security flags is shown. The EJTAG functionality may be disabled upon bootstrapping to the boot ROM memory 162 (e.g., block 278) The boot ROM code 163 may, after setting up the I/O circuit driver for the OTP memory 122, read the security flag values for the EJTAG enables from the OTP memory 122 (e.g., block 280). If an EJTAG enable is allowed (e.g., the BASELINE branch of decision block 282), the EJTAG probe may be enabled when leaving the boot ROM module 162 (e.g., block 284). If an EJTAG enable is allowed via authentication (e.g., the AUTHENTICATE branch of decision block 282), the boot ROM code 163 may execute a challenge portion of the EJTAG authentication procedure, if programmed in the boot ROM module 162 (e.g., block 286). After the challenge portion, a response portion of the EJTAG authentication procedure may be performed (e.g., block 287). Upon successful authentication (e.g., the YES branch of decision block 288), the EJTAG probe may be enabled when leaving the boot ROM module 162 (e.g., block 284). Otherwise (e.g., the NO branch of decision block 288), the EJTAG probe may be disabled when leaving the boot ROM module 162 (e.g., block 290). If an EJTAG enable is disallowed (e.g., the LOCKED branch of decision block 282), the EJTAG probe may be disabled by the boot ROM code (e.g., block 290). Disabling the EJTAG probe may include masking an input signal (e.g., TDI)(e.g., block 291).

The boot ROM module 162 may contain a routine at a debug exception vector that may cause a jump-to-self to lock the system 100. Assertion of the debug exception vector may be caused by an attempt to gain control of the system 100 illegitimately.

In order to ensure security in the system 100, the exception vectors enabled during the execution of the boot ROM code should be able to detect abuse of normal and debug exception mechanisms and the exception vectors should be thwarted. Therefore breaking into the system 100 in a privileged state and determining the contents of various sensitive memory locations may be difficult to impossible. All intercepted exceptions should essentially jump-to-self in order to lock the system 100 from illegal access. Interception of the exceptions is generally a firmware issue using no specialized hardware.

The cache RAMs for the CPU module 174 may not be accessible functionally via external pins. Software may place the cache memories into a software test mode, allowing the software to read the contents of the cache. However, when the cache is used in security features, the CPU module 174 is generally under control of the boot ROM firmware and is impervious to outside control. The boot ROM firmware may be written to ensure that the cache contents may not be read later by clearing the caches before exiting the Secure Privileged mode.

The security mode flags in the security flags module 146 generally indicate the current security levels present in the device. In addition, a register may be provided in the security flags module 146 that holds a Set Top Box ID for application visibility. The security flag bits may be manipulated using writes to a register in the I-Bus space. A notation of "Write X only" generally indicates that an attempt to write a value other than that X may be ignored.

Referring to FIGS. 5A–D, block diagrams of several example registers are shown. A register in FIG. 5A may be referred to as a Security Resource Control (SRC) register 292. In one embodiment, the SRC register 292 may be located at an I-Bus 128 address of 0xBE060000 (hexadecimal). The SRC register 292 generally contains the register bits that control operations of the security modules in the component 102. Several security flags within the SRC register 292 may be implemented as four-bit values. The four-bit values may prevent over-clocking or power supply manipulations from allowing the less secure states to be entered without software control. The least secure state (meaning the software has more rights) may be a single value of many possible values. All other states may be "more" secure.

The SRC register 292 generally comprises a flag 294, a flag 300, a flag 302, a flag 306 and a flag 308. The flags 294 and 302 may be reserved (R) flags. The flag 300 may operate as an EJTAG Disable (EDIS) flag. The flag 306 may operate as a Debug (DGB) flag. The flag 308 may operate as a Security mode (SEC) flag.

While the flag SEC is set to 8'hAA, the component 102 may be set to the Secure Disabled mode. While the flag SEC is set to 8'h55, the component 102 may be set to the Secure Privileged mode. While the flag SEC is set to anything else, the component 102 may be set to the Secure Application mode.

For ease of understanding, the value of 8'hAA may be referred to as "SEC_DIS", 8'h55 may be referred to as "SEC_PRIV" and all other values may be referred to as "SEC_APP", unless a particular value is specified precisely. The boot ROM firmware may modify the flag SEC bits to disable all secure resource protection. Modifying the flag SEC bits may disable all on-chip security. The boot ROM firmware may modify the flag SEC bits to indicate that the boot ROM firmware has completed execution. Completing execution from the boot ROM module 162 generally disables all future attempts to access the boot ROM module 162. Any future accesses to the boot ROM module 162 address space may be mapped to the B-Bus 152 and FLASH memory 104. A summary of access by the various sources on the B-Bus 152 based upon the flag SEC bits may be shown in Table IV as follows:

TABLE IV

| Mode | Source | Read Privilege | Write Privilege |
|---|---|---|---|
| Secure Disabled | All | All | Write SEC_DIS only |
| Secure Application | All | All | Write SEC_DIS only |
| Secure Privileged | CPU | All | Write SEC_APP, SEC_DIS only |
| Secure Privileged | Non-CPU | None | None |

The values of SEC[7:0] and the associated security mode definitions, are generally shown in Table V as follows:

TABLE V

| SEC [7:0] | Definition |
|---|---|
| 8'hAA | Secure Disabled |
| 8'h00-54, 8'h56-A9, 8'hAB-FF | Secure Application |
| 8'h55 | Secure Privileged |

The flag DGB is generally a single read-only bit. The flag DGB may be used by the boot ROM code to determine if an access to the debug exception vector within the boot ROM module 162 should be handled. Attempts to write to the flag DGB are generally unsuccessful. Access to the flag DGB may be summarized in Table VI as follows:

TABLE VI

| Mode | Source | Read Privilege | Write Privilege |
|---|---|---|---|
| Secure Disabled | All | All | None |
| Secure Application | All | All | None |
| Secure Privileged | Non-CPU | Restricted | Restricted |

The flag EDIS may be implemented as a four-bit value. The meaning of the flag EDIS[3:0] is generally summarized below in Table VII as follows:

TABLE VII

| EDIS [3:0] | Definition |
|---|---|
| 4'hA | EJTAG Probe Enabled |
| All others | EJTAG Probe Disabled |

For ease of understanding, the value of 4'hA may be referred to as "EJ_EN" and all others as "EJ_DIS", unless a particular value is specified precisely. The boot ROM firmware may modify the flag EDIS bits to EJ_EN in order to enable all of the EJTAG functionality. Application software may modify the flag EDIS bits to increase EJTAG security (e.g., disable EJTAG functionality) but may not be able to clear the flag EDIS. Reset values for the flag EDIS may be summarized in Table VIII as follows:

TABLE VIII

| DGB | EDIS [3:0] Rest to: |
|---|---|
| 0 | EJ_DIS (e.g., 4'hF) |
| 1 | EJ_EN |

Access to the flag EDIS may be summarized in Table IX as follows:

TABLE IX

| MODE | Source | Read Privilege | Write Privilege |
|---|---|---|---|
| Secure Disabled | All | All | Write EJ_EN only |
| Secure Application | All | All | Write EJ_DIS only |
| Secure Privileged | CPU | All | All |
| Secure Privileged | Non-CPU | None | None |

The fields R may be tied to the logical zero value. The fields R are generally read as zero and may not be writable. The application software should write the R bits to logical zero to preserve functionality in future revisions of the hardware.

Figure 5A:
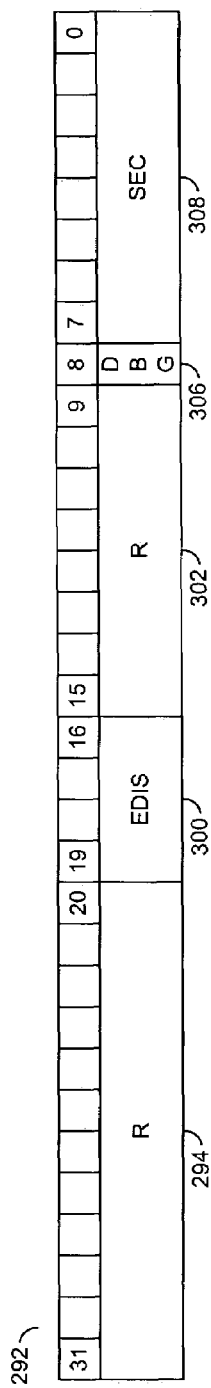
FIGS. 5A–D are block diagrams of several example registers.
Figure 5B:
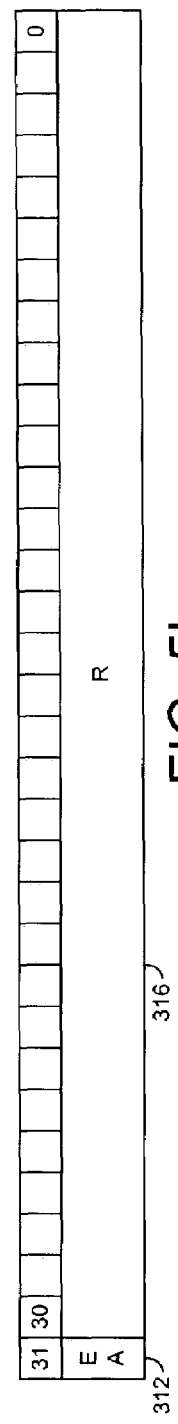

Referring to FIG. 5B, a block diagram of a vendor register 310 is shown. The vendor register 310 generally comprises a flag 312 and a flag 316. The vendor register 310 may be located at an address of 0xBE060004 (hexadecimal) in the B-Bus 152 address space. Each bit of the flags 312 and 316 may be set to the logical zero value at reset. Therefore, a default vendor register 310 may contain the value 0x0fffffff (hexadecimal). The flag 316 may contain reserved (R) bits.

The flag 312 may be implemented as a single-bit EJTAG Authentication (EA) bit. While the EA bit has the logical zero value, the EJTAG Authentication may be disabled. While the EA bit has the logical one value, the EJTAG Authentication may be enabled. The boot ROM firmware may modify the EA bit to enable or disable the EJTAG authentication. The application software may not write the EA bit. The EA bit may have a reset value of 1'b0. Access to the flag EA may be summarized in Table X as follows:

TABLE X

| MODE | Source | Read Privilege | Write Privilege |
|---|---|---|---|
| Secure Disabled | All | All | All |
| Secure Application | All | All | None |
| Secure Privileged | CPU | All | All |
| Secure Privileged | Non-CPU | None | None |

Figure 5C:
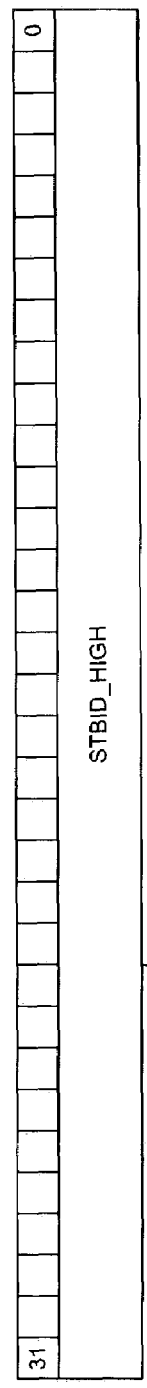

Referring to FIG. 5C, a block diagram of a Set Top Box ID High register 322 is shown. The Set Top Box ID High register 322 generally comprises a 32-bit field 324. The field 324 may be designated as a high word (e.g., STBID_HIGH) of an overall set top box identification value. The Set Top Box ID High register 322 generally has an address of 0xBE060008 (hexadecimal) in the B-Bus 152 address space. Access to the Set Top Box ID High register 322 may be granted to the CPU module 174 while executing from the boot ROM module 162, read-only to the CPU module 174 while not executing from the boot ROM module 162, and no access for non-CPU masters while in the Secure Privileged mode. The field STBID_HIGH may have a reset value of 0xffffffff (hexadecimal). The field STBID_HIGH may be set at boot by the CPU module 174 by reading the STB ID value from the OTP memory 122. No other master, including the CPU module 174 while in Secure Application or Secure Disabled mode, may write to the STBID_HIGH field.

Figure 5D:
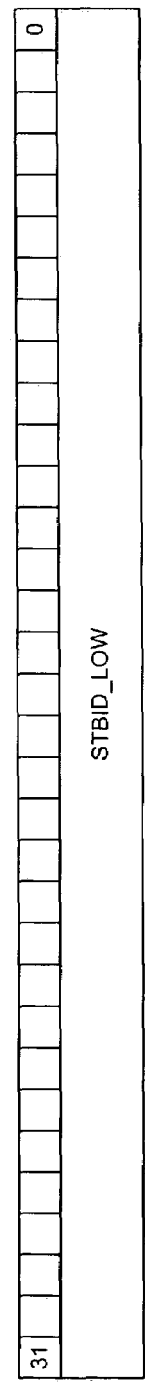

Referring to FIG. 5D, a block diagram of a Set Top Box ID LOW register 326 is shown. The Set Top Box ID LOW register 326 generally comprises a 32-bit field 328. The field 328 may be designated as a high word (e.g., STBID_LOW) of the overall set top box identification value. The Set Top Box ID LOW register 326 generally has an address of 0xBE06000C (hexadecimal) in the B-Bus 152 address space. Access to the Set Top Box ID LOW register 326 may be granted to the CPU module 174 while executing from the boot ROM module 162, read-only to the CPU module 174 while not executing from the boot ROM module 162, and no access for non-CPU masters while in the Secure Privileged mode. The field STBID_LOW may have a reset value of 0xffffffff (hexadecimal). The field STBID_LOW may be set at boot by the CPU module 174 by reading the STB ID value from the OTP memory 122. No other master, including the CPU module 174 while in Secure Application or Secure Disabled mode, may write to the STBID_LOW field.

In order to prevent other modules from having to decode the various four-bit values for each multi-bit security flag, the security flags module 146 may decode the values into a set of signals that indicate the security levels. Two signals may be decoded for the SEC[7:0] field. A signal (e.g., SECURE_PRIVILEGED_MODE) may indicate that the Secure Privileged mode is active. A signal (e.g., SECURE_APPLICATION_MODE) may indicate that the Secure Application mode is active. In the event that the component 102 is in Secure Disabled mode, both of the signals SECURE_PRIVILEGED_MODE and SECURE_APPLICATION_MODE may be inactive.

Figure 6:
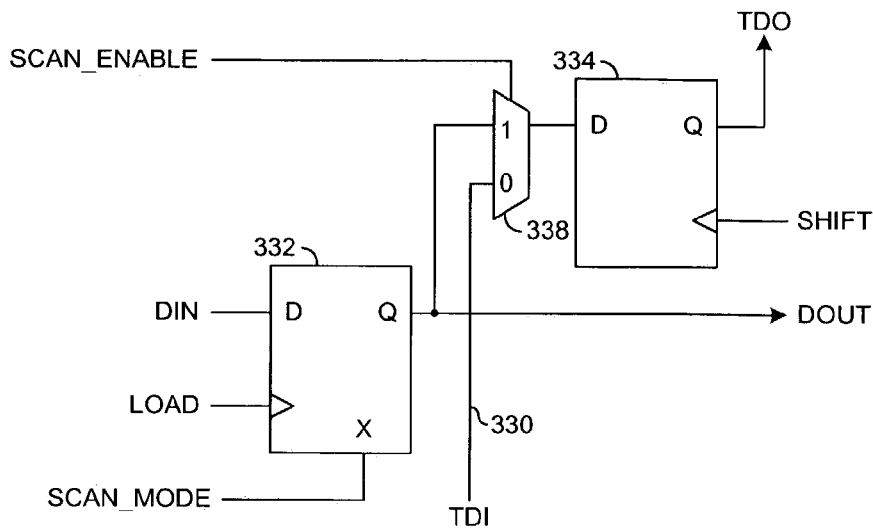
FIG. 6 is a block diagram of a portion of a scan chain.

Referring to FIG. 6, a block diagram of a portion of a scan chain 330 is shown. The scan chain 330 may be routed through the security related registers of the security flag module 146, and/or in other modules. An example single bit of a security related register may be indicated by a flip-flop 332. The scan chain 330 may be disabled for the flip-flop 322 while a signal (e.g., SCAN_ENABLE) is deasserted. A flip-flop 334 may provide temporary storage of a value (e.g., DOUT) loaded from the flip-flop 332 into the scan chain 330, or from an upstream flip-flop (not shown) in the scan chain 330, based upon a signal (e.g., SHIFT). The flip-flop 334 may generate and transmit a data signal (e.g., TDO) to a downstream flip-flop (not shown) in the scan chain 330. A multiplexer 338 may allow the scan chain 330 to (i) bypass or disable the flip-flop 332 and (ii) sample the flip-flop 332.

During a wafer probe test, the component 102 to be placed into scan mode and the signal SCAN_ENABLE may be asserted by the security flags module 146. During package testing of the secure part 102, the scan chain 330 may bypass the flip-flop 332 by holding the signal SCAN_ENABLE inactive in the logical zero state. While the signal SCAN_ENABLE is in the logical one state, the contents of the flip-flop 332 (e.g., the signal DOUT) may be visible on the scan chain 330.

Logic (e.g., the X input of the flip-flop 332 may be a Set input or a Clear input) may be implemented to tie off the values to the security related registers (e.g., flip-flop 332) to predetermined secure states while a signal (e.g., SCAN_MODE) is active. The logic may prohibit registers upstream from controlling, via functional paths and a scan "evaluate" phase, the contents of the security related registers. The logic may set the values SRC[SEC]=SEC_APP and SRC[EDIS]=EJ_DIS if the scan mode is indicated and a functional clock (e.g., LOAD) is toggled. The logic may prohibit use of the scan chain 330 indirectly from placing the part 102 into a looser security state, such as the Secure Disabled state.

Functional testing of the security related registers is generally not feasible prior to programming the OTP memory 122. In the Secure Disabled mode, the values that the security related registers may take is limited. However, once the OTP memory 122 has been programmed, the CPU module 174 may leave the Secure Privileged mode and transition to the Secure Application mode instead. In the Secure Application mode, the security related bits may be much more testable. Some of the security registers may not read/write in the Secure Application mode, but if the part 102 is functioning correctly, the functional test software should be able to read back the contents that were programmed into the OTP memory 122 from the security registers. A unique test program per chip may be used to read the security values from the OTP memory 122. The unique test programs may be performed at the customer's location at which the parts 102 have been programmed. Verification of the security register may not be complex as the unique test program that configures the part 102 may already know the unique chip information (e.g., chip ID, etc.) in order to test the design correctly. The on-site testing may filter the remaining test escapes leaving the component manufacturer as a result of the secure scan chain.

The OCM module 130 is generally responsible for providing both the boot ROM module 162 and the precise boot ROM execution termination logic module 166 tightly coupled to a pipeline of the CPU module 174, to prevent windows of insecure operation. The OCM module 130 may sit exclusively in the uncacheable address range of the C-Bus 150. Although the RISC processor 132 memory map may allow the OCM module 130 to sit in a cacheable address range as well, the choice of the uncacheable address range generally eliminates a possibility that the secure code may be cached.

The OCM module 130 generally sits on the CPU system C-Bus 150. The C-Bus 150 may support the OCM module 150 via a simple interface. An address may be brought out of the processor 132 that the decode module 168 may decode and claim before the address reaches the CPU caches and the B-Bus 152. Although running uncached, accesses to the boot ROM module 162 memory space may be very fast as the OCM module 130 may have an access time allowing zero wait-state accesses, duplicating the performance of cached code.

Following a hardware reset, the CPU module 174 may boot from the boot ROM module 162. The boot operation is generally controlled by the SRC[SEC] bits. If the SRC[SEC] bits are equivalent to SEC_PRIV, the CPU module 174 may boot from and execute from the internal boot ROM module 162. If the SRC[SEC] bits are equivalent to SEC_DIS, the CPU module 174 may boot from and/or execute from the FLASH memory 104. If the SRC[SEC] bits are equivalent to SEC_APP, the CPU module 174 may execute from the FLASH memory 104.

Software 163 running from the boot ROM module 162 may have privileged status as a Secure Privileged mode device, with full access to the entire address map of the component 102. Control of the privileged access is generally provided by the security supervisor hardware module 136.

The security supervisor module 136 may identify if an instruction being executed is from the boot ROM module 162, and if so, enable read and write access to all protected address regions.

The exit from the boot ROM module 162 may be precise. With only a single secure memory region, such as the boot ROM module 162, clearing one or more bits enabling execution from the boot ROM module 162 and executing a jump to the normal boot vector in the FLASH memory 104 may be difficult. Furthermore, the pipeline in the CPU module 174, write buffering, and indeterminate latencies on the B-Bus and I-Bus interfaces may increase the difficulty of a proper exit in executing from the boot ROM module 162. As such, the OCM module 130 may implement a very precise method that determines when the bits have been set to switch the system from Secure Privileged mode (e.g., executing from the boot ROM module 162) to the Secure Application mode. The precise boot ROM exit logic module 166 may mimic the CPU pipeline to determine when to exit. A store to the SRC register 292 with an intent to change the SEC[7:0] field from SEC_PRIV to SEC_APP or SEC_DIS, and to configure any other bits for operation outside the boot ROM module 162, may be observed by the precise boot ROM exit logic module 166. The precise boot ROM exit logic module 166 may indicate that the bits in the SRC register 292 may be changed at a precise time, in accordance with the CPU pipeline, to the bits in the SRC register 292 actually sitting on the I-Bus.

Figure 7:
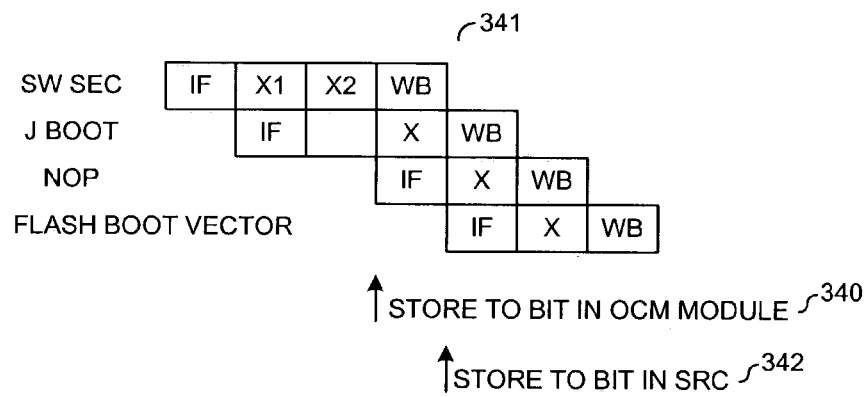
FIG. 7 is a block diagram illustrating a firmware sequence to exit a boot ROM module.

Referring to FIG. 7, a block diagram illustrating the firmware sequence to exit the boot ROM module 162 is shown. The precise boot ROM exit logic module 166 may register the updated SRC value at the end of the X2 execute stage (e.g., at time 340) of the CPU module pipeline 341. The updated SRC values may be sent to an I-Bus addressable register (e.g., in the security supervisor module 136) and written at the end of the WB write-back stage of the CPU instruction (e.g., at time 342). The write at time 342 to the SRC register 292 may also pass through a write buffer (not shown) and may eventually occur again while in the Secure Application mode or Secure Disabled mode. The second write to the SRC register 292 may have a possible, but unlikely and harmless effect of decreasing security levels that an application software had just set at normal boot time (e.g., the application software may have raised a security state from what was programmed in the OTP memory 122.) Since the OTP memory 122 may be the ultimate source of controlled security, the second write to the SRC register 292 is generally a don't-care scenario. Other security related registers may be updated in other ways to help ensure precise exit from the boot ROM module 162.

The tamper protection module 164 may detect that the CPU module 174 has vectored from the boot ROM module 162 while still executing in the Secure Privileged mode. Vectoring from the boot ROM module 162 prematurely may potentially be caused by over-clocking or power-glitching the part 102. Over-clocking or power-glitching the part 102 may cause the CPU module 174 to fetch an instruction that is not targeted to the on-chip boot ROM module 162 while in Secure Privileged mode. In the event that the tamper detect module 164 detects an improper vector, the tamper detect module 164 may immediately transition the part 102 into the Secure Application mode by changing the value in the flag SEC.

The OCM module 130 may be surrounded by a scan wrapper 131 to be used for scan test of the memory within. The precise exit logic module 166 may be part of the disable-able scan chain(s) 173 of the core processor circuit 144. Other test architectures for the OCM module 130 may be implemented to meet the criteria of a particular application.

Referring to FIG. 8, a table of a security supervisor module 136 protection process is shown. For the purposes of the table shown in FIG. 8, "Other" masters encompass an E-Bus 108 external master (e.g., master circuit 106) and the CPU module 174, where appropriate. Notes in the table may be as follows:

(1) The registers that may be written as defined in the security flags module 146.

(2) Registers typically may only be written, if at all, to indicate a higher security level.

The security supervisor module 136 may be a conceptual block that implements a fixed protection scheme for the address map of the component 102. The source/target detector module 170 within the security supervisor module 136 generally uses the following information to determine the source of an access that is being supervised: (i) identification of the master that is accessing the B-Bus 152 and (ii) the absolute address of the current instruction executing in the CPU module 174. The master may be one of the CPU core module 174 or the E-Bus controller module 148.

The security supervisor module 136 may use the address to which the transaction is going to determine the destination of the access and then rule on the validity of the transaction based on the table shown in FIG. 8. In order to ensure security, the comparison addresses should be fixed such that there may be no programmability of the address comparison values. Because of the CPU pipeline, there is generally a latency between the CPU module 174 fetching an instruction from an address and the execution of that instruction. To ensure synchronization of both indications that the CPU module 174 is initiating a B-Bus 152 transaction and is executing from a specific area in memory, a few non-operation instructions may be placed after a load instruction or a store instruction that falls near a jump or branch that may cause the CPU module 174 to leave the privileged area. Otherwise, the load or store indications might fail to be synchronized. However, as long as the boot ROM module 162 is exited properly, the lack of synchronization should not be a concern. However, branching outside of the boot ROM module 162 while still in Security Privileged mode may present a security issue.

When the source/target detector module 170 detects an improper transaction on the B-Bus 152, the security supervisor module 136 may subvert the B-Bus 152 transaction. For a read transaction, a receive command signal from the source to the target may be forced inactive by the security supervisor module 136 through the multiplexer 138 to prevent the target from seeing the read. A ready signal from the target to the source (or master) may be forced active by the security supervisor module 136 through the multiplexer 142 to prevent the master from hanging waiting for a response. The security supervisor module 136 generally returns a predetermined value (e.g., 0x00000000) as data to the master. The master may consider the predetermined data as a valid return.

For a write transaction, the transmit command signal from the master to the target may be forced inactive by the security supervisor module 136 through the multiplexer 138 to prevent the target from seeing the write. A ready signal from the target to the master may be forced active by the security supervisor module 136 through the multiplexer 142 to prevent the master from hanging waiting for a response.

The security supervisor module 136 may not provide known data on a write, as the write may not take place.

The EJTAG enable module 134 may mask a data input signal (e.g., TDI) to an interface 175 of the EJTAG debug port module 176 on a scan chain 177 in the RISC processor 132. Masking the signal TDI may allow a TAP state machine within the EJTAG debug port module 176 to change states, but may lock the instruction type to BYPASS. Allowing the TAP state machine to operate generally permits an on-chip JTAG controller to work properly. EJTAG security levels of Baseline, Authenticate or Locked, corresponding to a high value of logical one on a signal generated by the security flags module 146, and decoded from the SRC[EDIS] bits to be active when SRC[EDIS] is equivalent to EJ_DIS, may mask the signal TDI and render the EJTAG port useless.

The CPU module 174 may reset to a state in which interrupts are disabled. The CPU reset state may be implemented so that interrupts may not take control of the component 102 before the boot ROM code 163 has a chance to set one or more predetermined bits to handle the interrupts.

The enable circuit 160 may prevent use of the interface between the I/O circuit 126 and the OTP memory 122 while in the Secure Application mode. Disabling the interface may be done at a top level of the decoder circuit 120. A buffer (not shown) within the enable circuit 160 driving a clock into the OTP memory 122 may have the data input driven to a logical one such that the clock may never be driven. A similar data input to a buffer (not shown) in the enable circuit 160 driving a write protect (WP) pin on the OTP memory 122 may also be driven to a logical one such that the write protect pin is never driven.

Disabling the interface to the OTP memory 122 may be performed if the signal SCAN_MODE is active (e.g., the signal that may be active the entire time that scan testing is performed). Disabling the interface to the OTP memory 122 may prevent the use of a boundary scan chain from getting access to the contents of the OTP memory 122.

Figure 9:
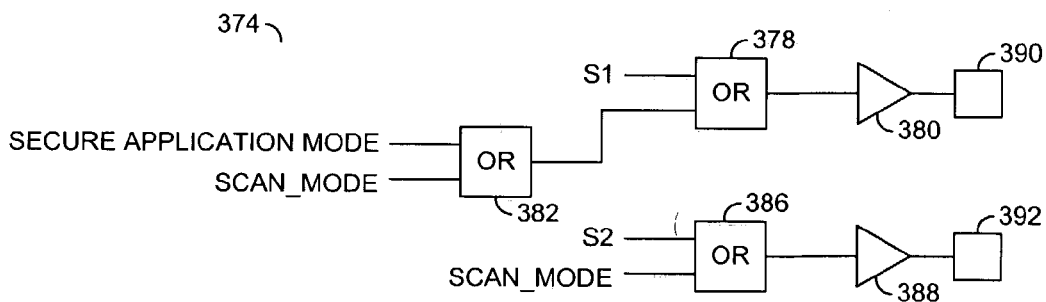
FIG. 9 is a block diagram of an example mechanism by which pins may be protected.

Referring to FIG. 9, a block diagram of an example mechanism 374 by which pins may be protected is shown. The mechanism or circuit 374 generally comprises a multiplexer 376, a logic gate 378, a buffer 380, a logic gate 382, a multiplexer 384, a logic gate 386 and a buffer 388. The buffer 380 may be connected to and drive a bonding pad or pin 390. The buffer 388 may be connected to and drive a bonding pad or pin 392.

A signal (e.g., S1) may be received by the gate 378. The signals SECURE_APPLICATION_MODE and SCAN_MODE may the logically OR'd together by the logic gate 382. The signals generated by the multiplexer 376 and the OR gate 382 may be logically OR'd by the logic gate 378, amplified by the buffer 380, and driven onto the pad 390. Therefore, while either or both of the signals SECURE_APPLICATION_MODE and SCAN_MODE are in the logical one state, the pad 390 may be forced to and held at the logical one state.

A signal (e.g., S2) may be logically OR'd with the signal SCAN_MODE. A result signal generated by the OR gate 386 may be amplified by the buffer 388 and driven onto the pad 392. Therefore, while the signal SCAN_MODE is in the logical one state, the pad 392 may be forced to and held at the logical one state.

The signals S1 and S2 may also be isolated from the boundary scan chain to prevent illegal control of the OTP memory 122. The signals S1 and S2 may be removed from the chain by tying off the inputs such that the boundary scan chain may not influence the respective values. Furthermore, the boundary scan chain may bypass the chain contribution of the signals S1 and S2 to the next pins downstream such that the boundary scan chain is unbroken. Pins for the external bus controller block 148 to the FLASH memory 104 may be on the boundary scan chain. Having the external bus controller block 148 to FLASH memory 104 interface in the boundary scan chain generally allows for proper testing of the manufactured component 102. As a result of the JTAG boundary scan chain:

1. Product testing generally uses two different sets of JTAG vectors.

2. Two different Boundary Scan Debug Layer (BSDL) files may be generated.

3. The Multi-Chip Module (MCM) pins in the JTAG boundary scan chain may not longer be tristated once bonded.

4. Leakage measurements of the MCM pins may no longer be possible.

5. Levels on the MCM pins may no longer be measurable.

Several features of the present invention may include, but are not limited to: (i) a security flags block that may implement registers containing on-chip values used to control the security operation, (ii) an on-chip memory module that may provide a ROM for a one-time-only boot execution, (iii) a security supervisor that may govern access to various on-chip secure resources based on legal source/destination combinations, (iv) an EJTAG enable module to control when the EJTAG Probe may be enabled, (v) a CPU with interrupts immediately disabled on reset and (vi) a special core processor circuit boundary scan chain.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation. Additionally, inverters may be added to change a particular polarity of the signals. As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the spirit and scope of the invention.

The invention claimed is:

1. A circuit comprising:
a plurality of logic modules configured to (i) store a plurality of values and (ii) force said values in storage to a plurality of predetermined values respectively while a scan mode signal is active; and
a security module configured to (i) disable a scan capability to read said values through a first scan chain while in a non-lowest security mode of at least three security modes and (ii) enable said scan capability to read said values through said first scan chain while in a lowest security mode of said at least three security modes.

2. The circuit according to claim 1, wherein said security module is further configured to deactivate said scan mode signal.

3. The circuit according to claim 1, further comprising:
an enable module configured to disable an interface to a test access port of said first scan chain in response to a disable signal generated by said security module.

4. The circuit according to claim 1, further comprising:
an enable module configured to disable an interface to a memory while said scan mode signal is active.

5. The circuit according to claim 4, wherein said first scan chain is further configured to bypass said interface to said memory while said scan mode signal is active.

6. The circuit according to claim 1, further comprising:
a processor having a second scan chain; and
a boot memory having a third scan chain connected in series to said second scan chain.

7. The circuit according to claim 6, wherein said security module is further configured to disable said second scan chain.

8. The circuit according to claim 1, wherein a portion of said first scan chain forms a register designated to store security information.

9. The circuit according to claim 8, wherein said security module is further configured to disable said first scan chain.

10. The circuit according to claim 9, wherein (i) said logic modules and said security module are part of a first chip and (ii) a memory coupled to said first chip is part of a second chip.

11. A method of operating a circuit, comprising the steps of:
(A) storing a plurality of values;
(B) disabling a scan capability to read said values through a scan chain while in a non-lowest security mode of at least three security modes;
(C) forcing said values in storage to a plurality of predetermined values respectively while a scan mode signal is active; and
(D) enabling said scan capability to read said values through said scan chain while in a lowest security mode of said at least three security modes.

12. The method according to claim 11, wherein (i) a multi-bit group of said values define said at least three security modes and (ii) said predetermined values in said multi-bit group correspond to an intermediate security mode of said at least three security modes.

13. The method according to claim 11, wherein (i) a multi-bit group of said values controls access to a test port and (ii) said predetermined values in said multi-bit group disable said test port.

14. The method according to claim 11, wherein (i) a group of said values control an authentication process governing access to said scan chain and (ii) said predetermined values in said group disable said authentication operation.

15. The method according to claim 11, further comprising the step of:
instructing said scan chain to bypass a plurality of registers while said scan mode signal is active.

16. The method according to claim 11, further comprising the step of:
disabling an interface to a memory while said scan mode signal is active.

17. The method according to claim 11, further comprising the step of:
disabling an interface to a memory while in an intermediate security mode of said at least three security modes.

18. The method according to claim 11, further comprising the step of:
    disabling an output pin while said scan mode signal is active.

19. The method according to claim 11, further comprising the step of:
    disabling an output pin while in a highest security mode of said at least three security modes.

20. A circuit comprising:
    means for (i) disabling a scan capability to read a plurality of values through a scan chain while in a non-lowest security mode of at least three security modes and (ii) enabling said scan capability to read said values through said scan chain while in a lowest security mode of said at least three security modes; and
    means for (i) storing said values and (ii) forcing said values in storage to a plurality of predetermined values respectively while a scan mode signal is active.

* * * * *